US010806056B2

(12) United States Patent
Cuda et al.

(10) Patent No.: US 10,806,056 B2
(45) Date of Patent: Oct. 13, 2020

(54) COOLING SYSTEM FOR HIGH-PERFORMANCE COMPUTER

(71) Applicant: Hewlett Packard Enterprise Development LP, Houston, TX (US)

(72) Inventors: Bret M. Cuda, Eau Claire, WI (US); Harvey J. Lunsman, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/654,132

(22) Filed: Jul. 19, 2017

(65) Prior Publication Data
US 2019/0029146 A1  Jan. 24, 2019

(51) Int. Cl.
*H05K 7/20* (2006.01)
*F28F 1/20* (2006.01)

(52) U.S. Cl.
CPC ..... *H05K 7/20763* (2013.01); *H05K 7/20781* (2013.01); *H05K 7/20809* (2013.01); *F28F 1/20* (2013.01)

(58) Field of Classification Search
CPC .................................................. H05K 7/20763
USPC ..... 361/679.46, 679.52, 718, 721, 699, 698, 361/702, 704
See application file for complete search history.

(56) References Cited

U.S. PATENT DOCUMENTS

| | | | |
|---|---|---|---|
| 5,283,715 A | 2/1994 | Carlsten et al. | |
| 5,940,270 A | 8/1999 | Puckett | |
| 8,027,162 B2 * | 9/2011 | Campbell | H05K 7/2079 165/104.33 |
| 8,238,101 B2 * | 8/2012 | Kalms | G06F 1/20 165/104.33 |
| 8,385,069 B2 * | 2/2013 | Iyengar | G06F 1/20 165/80.4 |
| 8,638,559 B2 * | 1/2014 | Barina | H01L 23/4093 165/104.21 |
| 2004/0257750 A1 | 12/2004 | Saita et al. | |
| 2007/0002536 A1 | 1/2007 | Hall et al. | |
| 2008/0225478 A1 | 9/2008 | Goettert et al. | |
| 2008/0264613 A1 | 10/2008 | Chu | |
| 2009/0027856 A1 * | 1/2009 | McCoy | G06F 1/20 361/699 |
| 2009/0262495 A1 | 10/2009 | Neudorfer | |
| 2011/0286175 A1 | 11/2011 | Iyengar et al. | |
| 2012/0020004 A1 | 1/2012 | Rau et al. | |
| 2014/0126142 A1 * | 5/2014 | Dean | G06F 1/20 361/679.47 |

(Continued)

OTHER PUBLICATIONS

Schmidt et al., High-end server low-temperature cooling, IBM J. Res. & Dev., vol. 46, No. 6, Nov. 2002, 739-751.

(Continued)

*Primary Examiner* — Mukundbhai G Patel

(57) ABSTRACT

A cooling system for blades of a high performance computer thermally couples blade electronics to the computer's liquid cooling system through one or more heat pipes, without requiring a liquid conduit on, or liquid coupling to, the blade. Moreover, illustrative embodiments allow a blade to be installed in a high performance computer and engage the cooling system without making a liquid connection, and to disengage from the cooling system and be removed from the high performance computer without breaking a liquid connection.

15 Claims, 13 Drawing Sheets

(56) References Cited

U.S. PATENT DOCUMENTS

2014/0238640 A1* 8/2014 Arvelo .................. F16L 41/10
                                                        165/76
2017/0127549 A1* 5/2017 Lunsman ............. H05K 7/1489

OTHER PUBLICATIONS

Silicon Graphics International Corporation, SGI and DoD Launch Supercomputer Spirit, the Fastest System in the Department, Press Release, Jun. 17, 2013, 3 pages.
Zahn, Cooling of chips and the principle of Heat Pipes, Computer Architecture Group, University of Heidelberg, 2013, 4 pages.
International Search Report and Written Opinion, International Application No. PCT/US2018/042901, dated Oct. 29, 2018, pp. 1-10, KIPO.

* cited by examiner

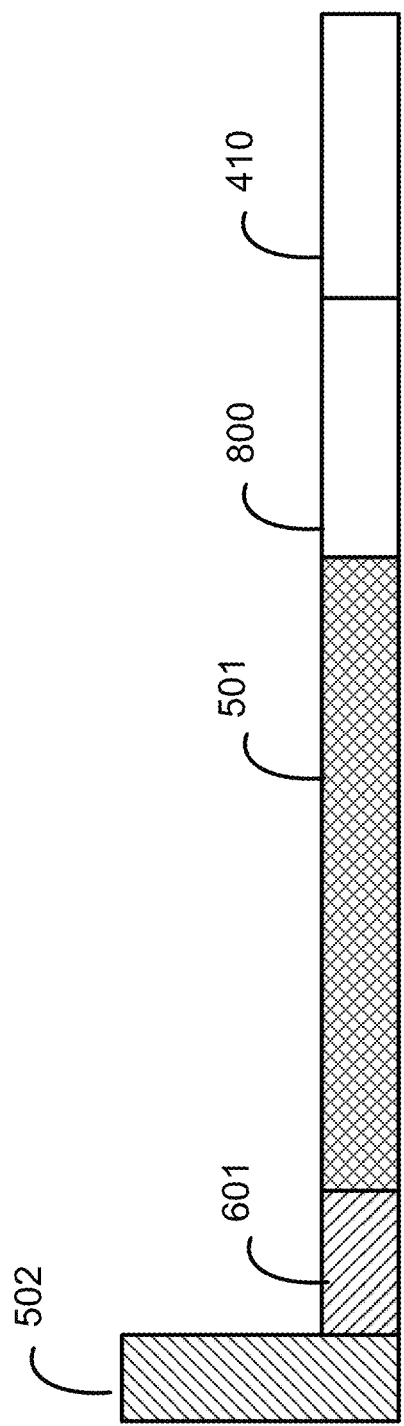
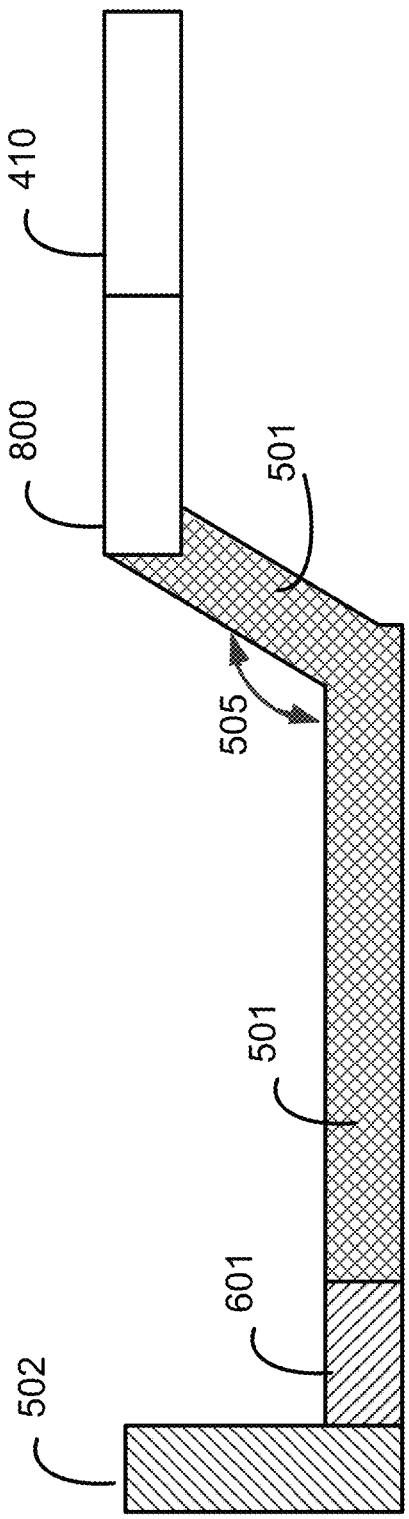

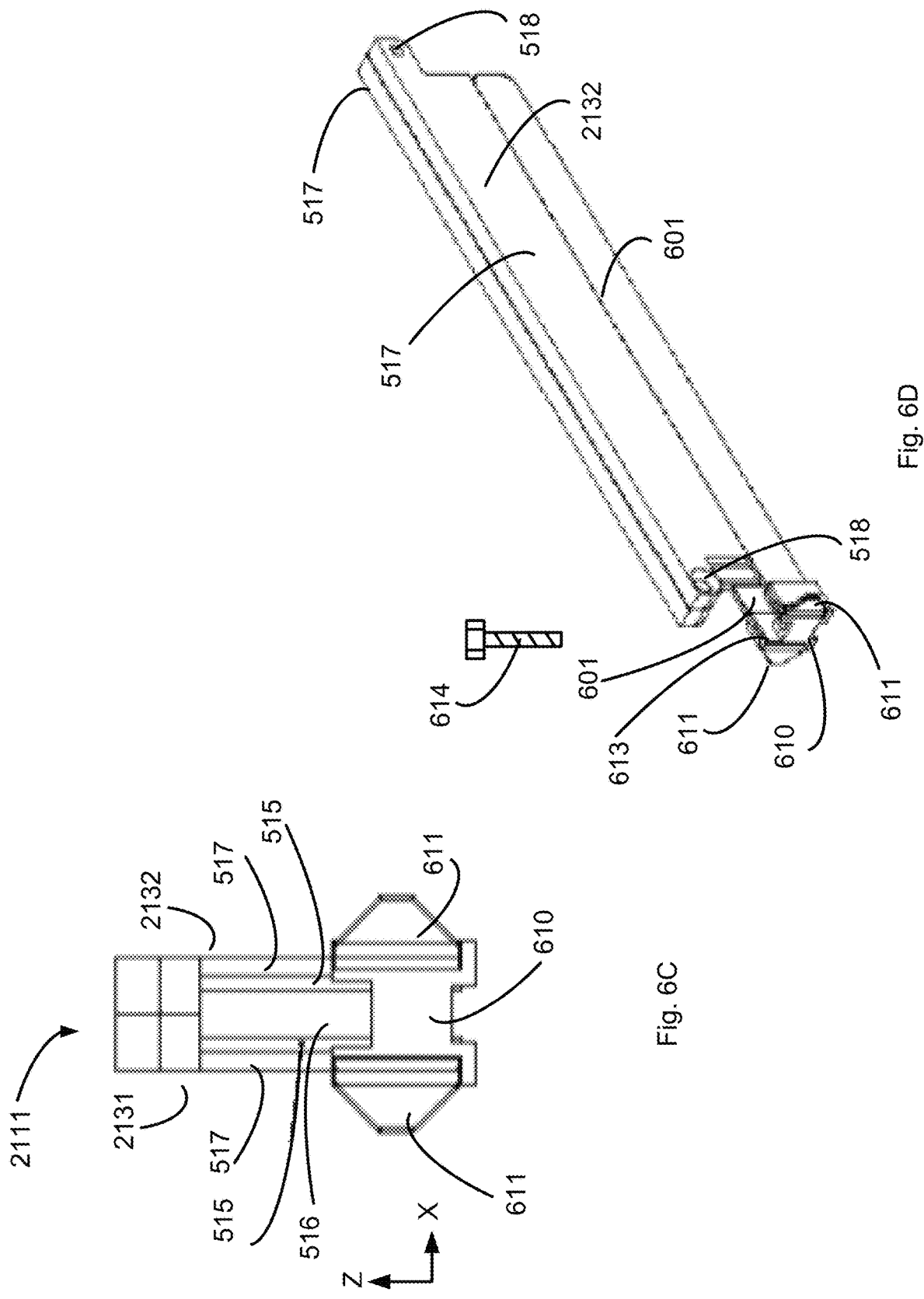

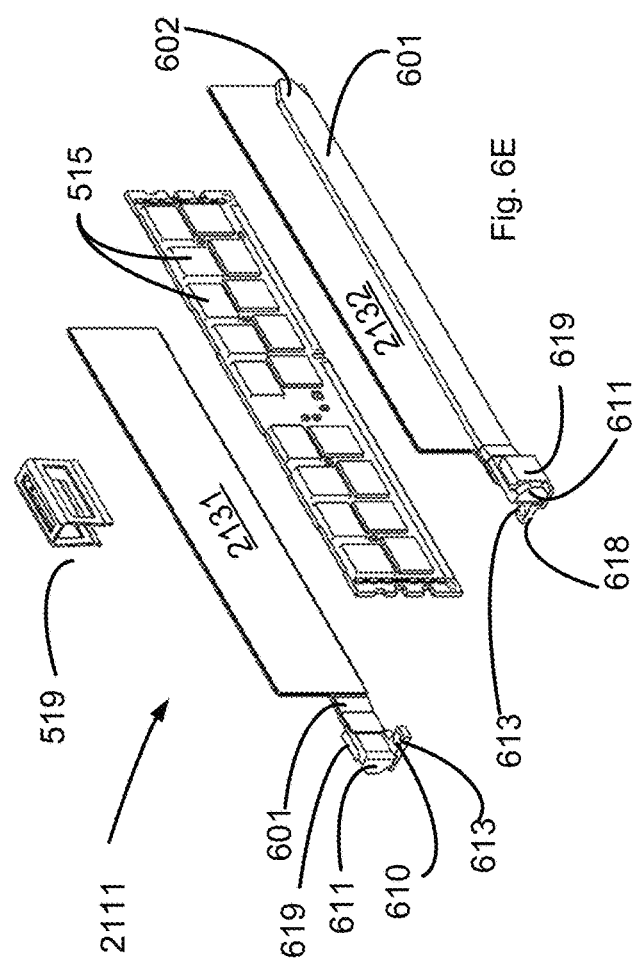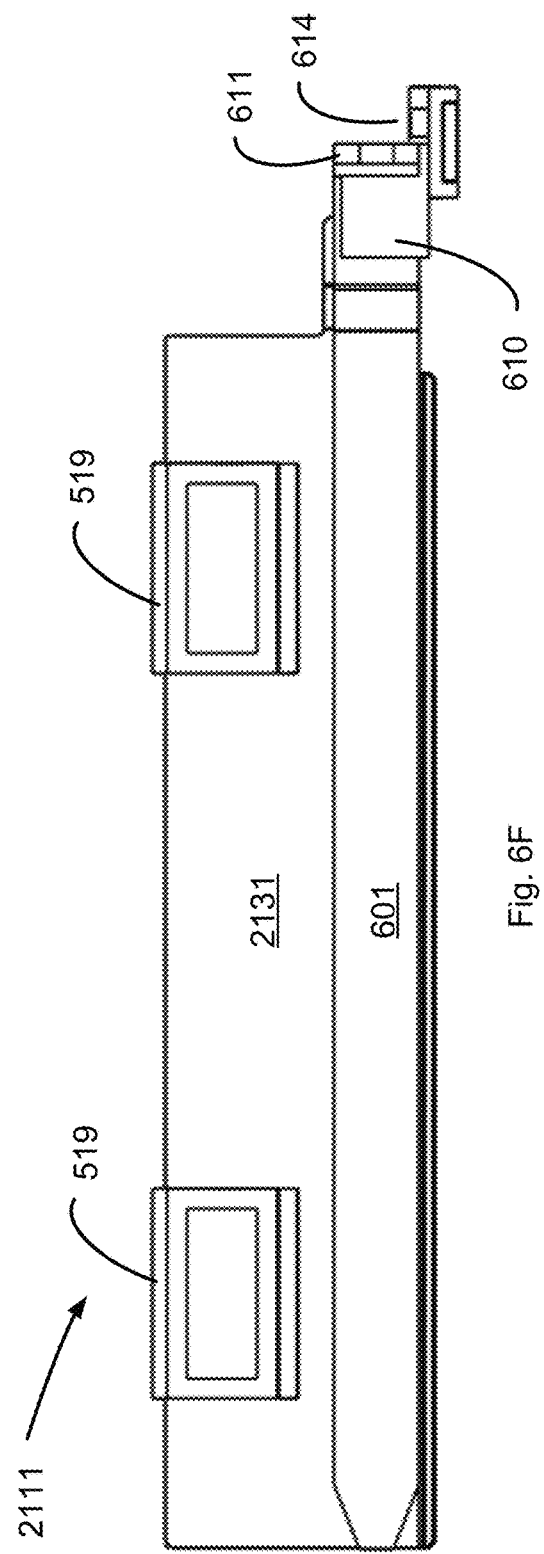

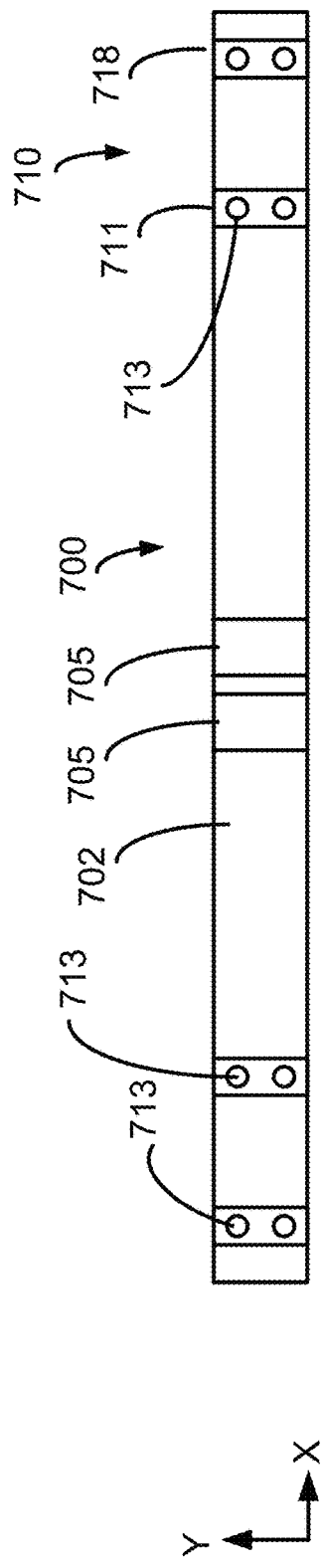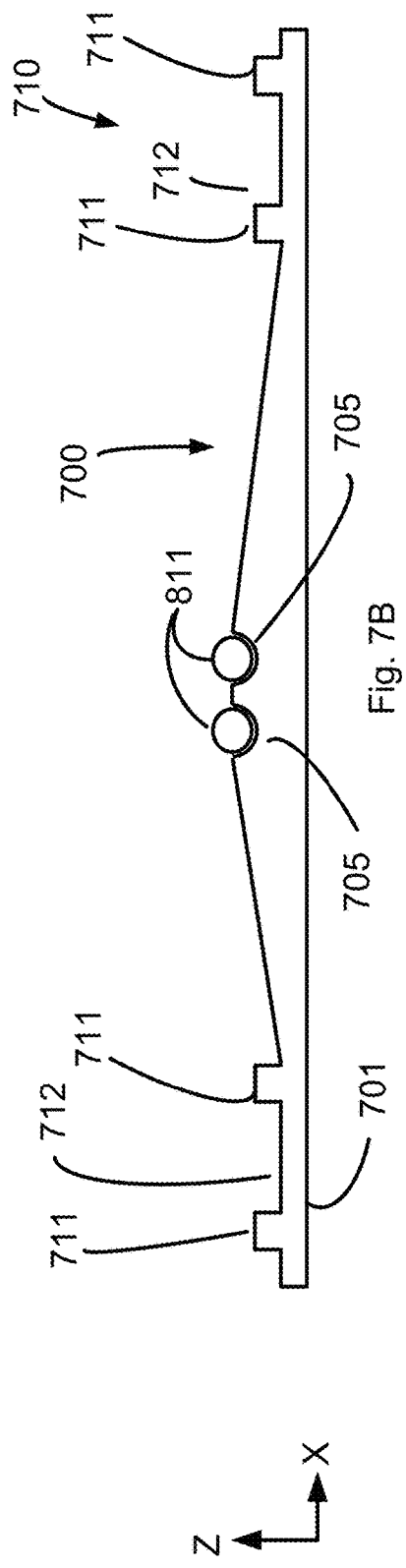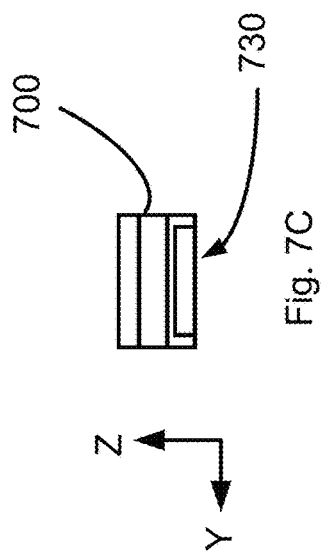

US 10,806,056 B2

COOLING SYSTEM FOR HIGH-PERFORMANCE COMPUTER

TECHNICAL FIELD

The present invention relates to high-performance computer systems, and more particularly to cooling systems for high-performance computer systems.

BACKGROUND ART

Electronic components of high-performance computer systems generate great quantities of heat during normal operation. It is known that such heat can adversely affect computer performance and reliability. Consequently, many computers include cooling systems, such as heat sinks, fans in typical home computers, and water-based cooling systems in more powerful home computers or mainframe computers.

SUMMARY OF VARIOUS EMBODIMENTS

Illustrative embodiments transfer heat generated by electronics on a blade of a high performance computer system into the computer's thermal reservoir without liquid exchange between the cooling loop and cooling elements at the blade electronics.

In a first embodiment, a cooling system for a blade of a high performance computer is in communication with a thermal reservoir, and includes a heat pipe coupled to a DIMM on the blade, to conductively receive thermal energy from the DIMM, and a dry thermal communication conduit having a high thermal conductivity, preferably of at least 100 W/(mK), thermally coupling the heat pipe to a liquid conduit in liquid communication with the thermal reservoir.

In some embodiments, the dry thermal communication conduit includes a transfer bar, and the heat pipe and transfer bar are configured to enable installation of the blade into the high performance computer such that the transfer bar operably engages a liquid cooling apparatus without making a liquid connection.

Some embodiments also include a transfer block thermally disposed between a heat pipe and a transfer bar, such that the transfer block in thermal communication with the heat pipe and in thermal communication with the transfer bar, to transmit the thermal energy from the heat pipe to the transfer bar. The transfer block may be secured to the transfer bar by at least one fastener, and/or may include an intermediate heat pipe.

In illustrative embodiments, the transfer bar includes a cooling system interface to physically and thermally couple to the transfer bar to the liquid conduit.

An embodiment of a computer system having a liquid cooling loop includes a first blade having a first electronic component and first heat pipe in thermal communication with the first electronic component, and a first transfer bar in thermal communication with the first heat pipe; and a second blade having a second electronic component and second heat pipe in thermal communication with the second electronic component, and a second transfer bar in thermal communication with the second heat pipe. In such a system, a cooling reservoir in dry thermal communication with the first transfer bar and the second transfer bar, such that the first heat pipe and first transfer bar are configured to transfer thermal energy from the first electronic component to the cooling reservoir via the liquid cooling loop, and the second heat pipe and second transfer bar are configured to transfer thermal energy from the second electronic component to the cooling reservoir via the liquid cooling loop.

To facilitate thermal conductivity, the first transfer bar and/or the second transfer bar may be made of copper or aluminum. Moreover, in some embodiments, the first transfer bar and/or the second transfer bar may include an intermediate heat pipe.

An embodiment of a DIMM module, for use in a high performance computer having a thermal reservoir, includes a first memory circuit; a first heat pipe in thermal communication with the first memory circuit to conductively receive heat generated by the first memory circuit; and a transfer block in thermal communication with the first heat pipe, to transfer the heat from the first memory circuit to the thermal reservoir. Some embodiments also include a second memory circuit separated from the first memory circuit by a gap pad; and a second heat pipe in thermal communication with the second memory circuit to conductively receive heat generated by the second memory circuit. The second heat pipe is in thermal communication with the transfer block to transfer the heat from the second memory circuit to the thermal reservoir. The first memory circuit and the second memory circuit in some embodiments are disposed between the first heat pipe and the second heat pipe. In some embodiments, the transfer block includes an aperture configured to allow a fastener to secure the DIMM module to a blade.

BRIEF DESCRIPTION OF THE DRAWINGS

The foregoing features of embodiments will be more readily understood by reference to the following detailed description, taken with reference to the accompanying drawings, in which:

FIGS. 5A and 5B schematically illustrates blade cooling components;

FIGS. 6A-6F schematically illustrate an embodiments of a DIMM;

FIGS. 7A-7E schematically illustrate an embodiment of a transfer bar

DETAILED DESCRIPTION OF SPECIFIC EMBODIMENTS

A cooling system for blades of a high performance computer ("HPC") thermally couples blade electronics to the computer's liquid cooling system though a dry, high thermal-conductivity conduit, without requiring a liquid coupling on the blade. In illustrative embodiments, the dry conduit forms a path of least thermal resistance for the flow of thermal energy from the blade electronics to the computer's liquid cooling system, which desirably mitigates or prevents flow of thermal energy from those blade electronics to the other components of the blade. Moreover, some embodiments allow the blade to be installed into the HPC, and to operably engage the computer's liquid cooling system, without having to make a liquid connection between the blade and a liquid cooling loop. Some embodiments also allow the blade to be removed from the HPC without having to disconnect a liquid connection between the blade and the liquid cooling loop.

Some embodiments achieve 99% liquid cooling of the high-performance computer system. This facilitates greater node density, making-high performance computer systems more efficient, and allowing users of high-performance computer systems greater flexibility with facility requirements. It also decreases the audible noise level in the data centre by reducing the need for fans.

For example, illustrative embodiments couple one or more heat pipes to blade electronics (e.g., DIMMs), and couple each heat pipe to the computer's liquid cooling system via a transfer bar. The blade, heat pipes, and transfer bar are removable from the HPC without having to disconnect a liquid connection from the computer's liquid cooling system. Some embodiments provide cooling sufficient to permit two blades to be placed in close proximity to one another, even to the point where the electronics of the two blades are interdigitated.

System Architecture

Figure 1:
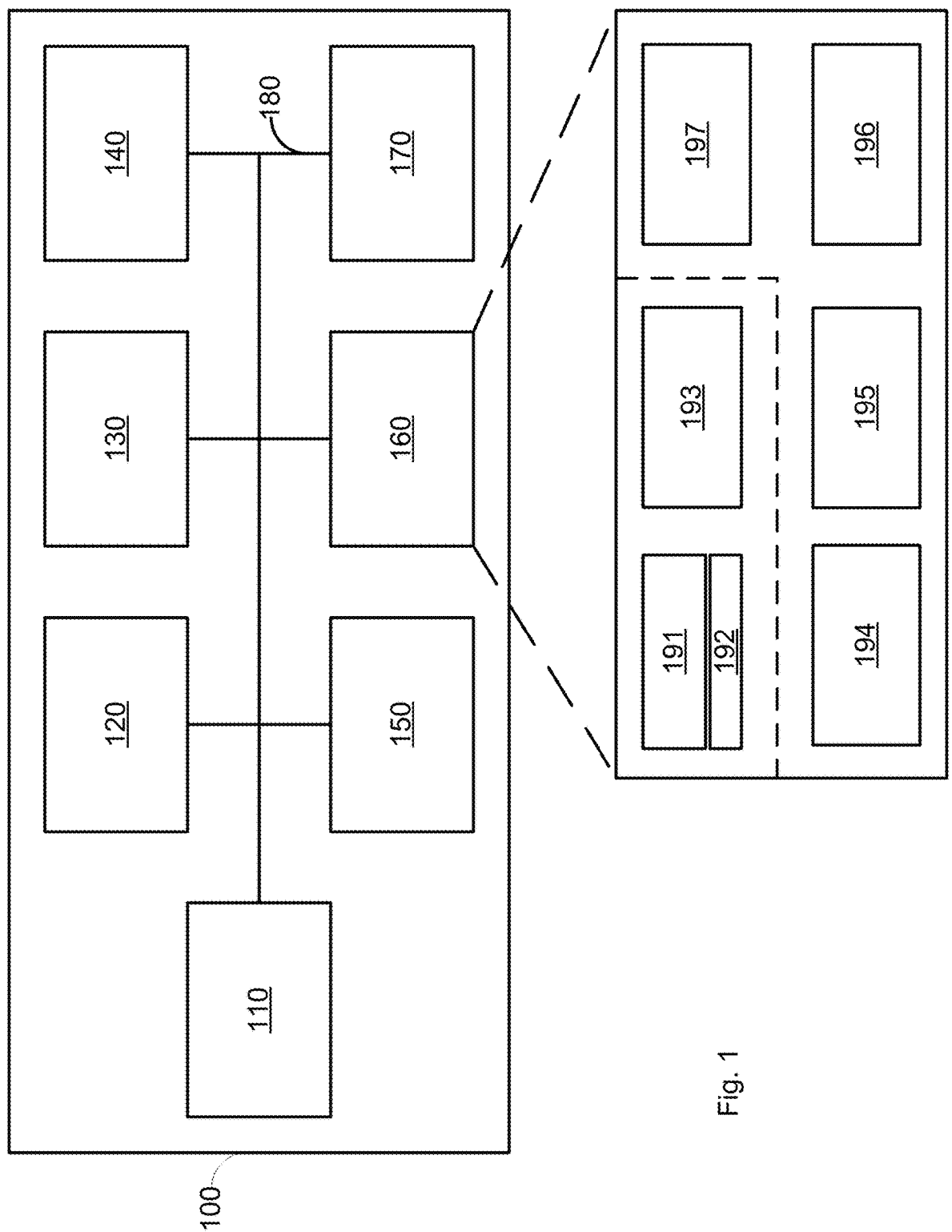
FIG. 1 schematically illustrates a logical view of an exemplary high-performance computing system.

FIG. 1 schematically shows a logical view of an exemplary high-performance computing system 100 that may be used with illustrative embodiments of the present invention. Specifically, as known by those in the art, a "high-performance computing system," or "HPC system," is a computing system having a plurality of modular computing resources that are tightly coupled using hardware interconnects, so that processors may access remote data directly using a common memory address space.

The HPC system 100 includes a number of logical computing partitions 120, 130, 140, 150, 160, 170 for providing computational resources, and a system console 110 for managing the plurality of partitions 120-170. A "computing partition" (or "partition") in an HPC system is an administrative allocation of computational resources that runs a single operating system instance and has a common memory address space. Partitions 120-170 may communicate with the system console 110 using a logical communication network 180. A system user, such as a scientist or engineer who desires to perform a calculation, may request computational resources from a system operator, who uses the system console 110 to allocate and manage those resources. Allocation of computational resources to partitions is described below. The HPC system 100 may have any number of computing partitions that are administratively assigned as described in more detail below, and often has only one partition that encompasses all of the available computing resources. Accordingly, this figure should not be seen as limiting the scope of the invention.

Each computing partition, such as partition 160, may be viewed logically as if it were a single computing device, akin to a desktop computer. Thus, the partition 160 may execute software, including a single operating system ("OS") instance 191 that uses a basic input/output system ("BIOS") 192 as these are used together in the art, and application software 193 for one or more system users.

Accordingly, as also shown in FIG. 1, a computing partition has various hardware allocated to it by a system operator, including one or more processors 194, volatile memory 195, non-volatile storage 196, and input and output ("I/O") devices 197 (e.g., network ports, video display devices, keyboards, and the like). However, in HPC systems like the embodiment in FIG. 1, each computing partition has a great deal more processing power and memory than a typical desktop computer. The OS software may include, for example, a Windows® operating system by Microsoft Corporation of Redmond, Wash., or a Linux operating system. Moreover, although the BIOS may be provided as firmware by a hardware manufacturer, such as Intel Corporation of Santa Clara, Calif., it is typically customized according to the needs of the HPC system designer to support high-performance computing, as described below in more detail.

As part of its system management role, the system console 110 acts as an interface between the computing capabilities of the computing partitions 120-170 and the system operator or other computing systems. To that end, the system console 110 issues commands to the HPC system hardware and software on behalf of the system operator that permit, among other things: 1) booting the hardware, 2) dividing the system computing resources into computing partitions, 3) initializing the partitions, 4) monitoring the health of each partition and any hardware or software errors generated therein, 5) distributing operating systems and application software to the various partitions, 6) causing the operating systems and software to execute, 7) backing up the state of the partition or software therein, 8) shutting down application software, and 9) shutting down a computing partition or the entire HPC system 100. These particular functions are described in more detail in the section below entitled "System Operation."

Figure 2:
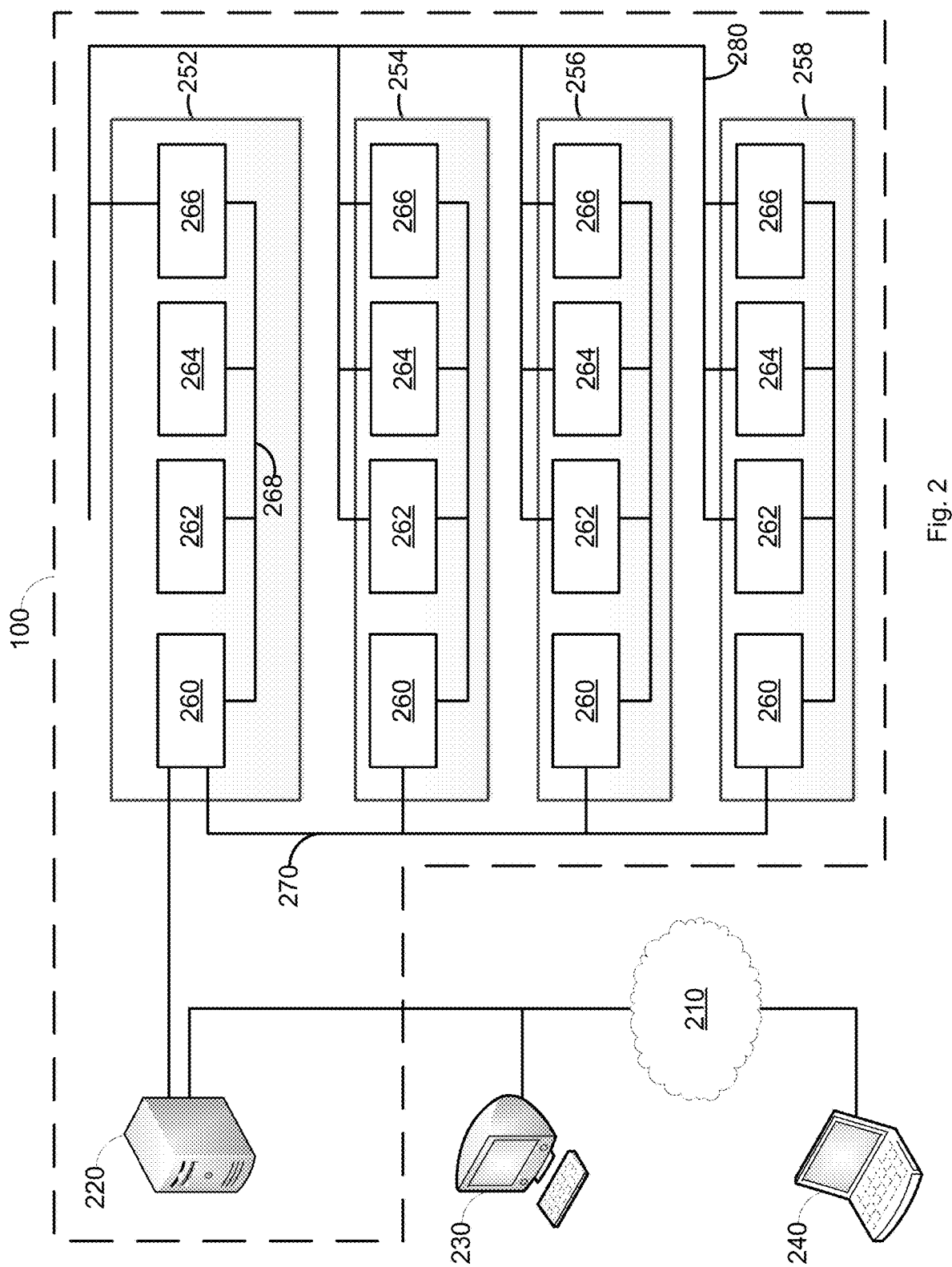
FIG. 2 schematically illustrates a physical view of an embodiment of a high performance computing system.

FIG. 2 schematically shows a physical view of a high performance computing system 100 in accordance with the embodiment of FIG. 1. The hardware that comprises the HPC system 100 of FIG. 1 is surrounded by the dashed line. The HPC system 100 is connected to a customer data network 210 to facilitate customer access.

The HPC system 100 includes a system management node ("SMN") 220 that performs the functions of the system console 110. The management node 220 may be implemented as a desktop computer, a server computer, or other similar computing device, provided either by the customer or the HPC system designer, and includes software necessary to control the HPC system 100 (i.e., the system console software).

The HPC system 100 is accessible using the data network 210, which may include any data network known in the art, such as a customer local area network ("LAN"), a virtual private network ("VPN"), the Internet, or the like, or a combination of these networks. Any of these networks may permit a number of users to access the HPC system resources remotely and/or simultaneously. For example, the management node 220 may be accessed by a customer computer 230 by way of remote login using tools known in the art such as Windows® Remote Desktop Services or the UNIX secure shell. If the customer is so inclined, access to the HPC system 100 may be provided to a remote computer 240. The remote computer 240 may access the HPC system by way of a login to the management node 220 as just described, or using a gateway or proxy system as is known to persons in the art.

The hardware computing resources of the HPC system 100 (e.g., the processors, memory, non-volatile storage, and I/O devices shown in FIG. 1) are provided collectively by one or more "blade chassis," such as blade chassis 252, 254, 256, 258 shown in FIG. 2, that are managed and allocated into computing partitions. A blade chassis is an electronic chassis that is configured to house, power, and provide high-speed data communications between a plurality of stackable, modular electronic circuit boards called "blades." Each blade includes enough computing hardware to act as a standalone computing server. The modular design of a blade chassis permits the blades to be connected to power and data lines with a minimum of cabling and vertical space.

Accordingly, each blade chassis, for example blade chassis 252, has a chassis management controller 260 (also referred to as a "chassis controller" or "CMC") for managing system functions in the blade chassis 252, and a number of blades 262, 264, 266 for providing computing resources. Each blade, for example blade 262, contributes its hardware computing resources to the collective total resources of the HPC system 100. The system management node 220 manages the hardware computing resources of the entire HPC system 100 using the chassis controllers, such as chassis controller 260, while each chassis controller in turn manages the resources for just the blades in its blade chassis. The chassis controller 260 is physically and electrically coupled to the blades 262-266 inside the blade chassis 252 by means of a local management bus 268, described below in more detail. The hardware in the other blade chassis 254-258 is similarly configured.

The chassis controllers communicate with each other using a management connection 270. The management connection 270 may be a high-speed LAN, for example, running an Ethernet communication protocol, or other data bus. By contrast, the blades communicate with each other using a computing connection 280. To that end, the computing connection 280 illustratively has a high-bandwidth, low-latency system interconnect, such as NumaLink.

The chassis controller 260 provides system hardware management functions to the rest of the HPC system. For example, the chassis controller 260 may receive a system boot command from the SMN 220, and respond by issuing boot commands to each of the blades 262-266 using the local management bus 268. Similarly, the chassis controller 260 may receive hardware error data from one or more of the blades 262-266 and store this information for later analysis in combination with error data stored by the other chassis controllers. In some embodiments, such as that shown in FIG. 2, the SMN 220 or a customer computer 230 are provided access to a single, master chassis controller 260 that processes system management commands to control the HPC system 100 and forwards these commands to the other chassis controllers. In other embodiments, however, an SMN 220 is coupled directly to the management connection 270 and issues commands to each chassis controller individually. Persons having ordinary skill in the art may contemplate variations of these designs that permit the same type of functionality, but for clarity only these designs are presented.

The blade chassis 252, its blades 262-266, and the local management bus 268 may be provided as known in the art. However, the chassis controller 260 may be implemented using hardware, firmware, or software provided by the HPC system designer. Each blade provides the HPC system 100 with some quantity of processors, volatile memory, non-volatile storage, and I/O devices that are known in the art of standalone computer servers. However, each blade also has hardware, firmware, and/or software to allow these computing resources to be grouped together and treated collectively as computing partitions, as described below in more detail in the section entitled "System Operation."

While FIG. 2 shows an HPC system 100 having four chassis and three blades in each chassis, it should be appreciated that these figures do not limit the scope of the invention. An HPC system may have dozens of chassis and hundreds of blades; indeed, HPC systems often are desired because they provide very large quantities of tightly-coupled computing resources.

Figure 3:
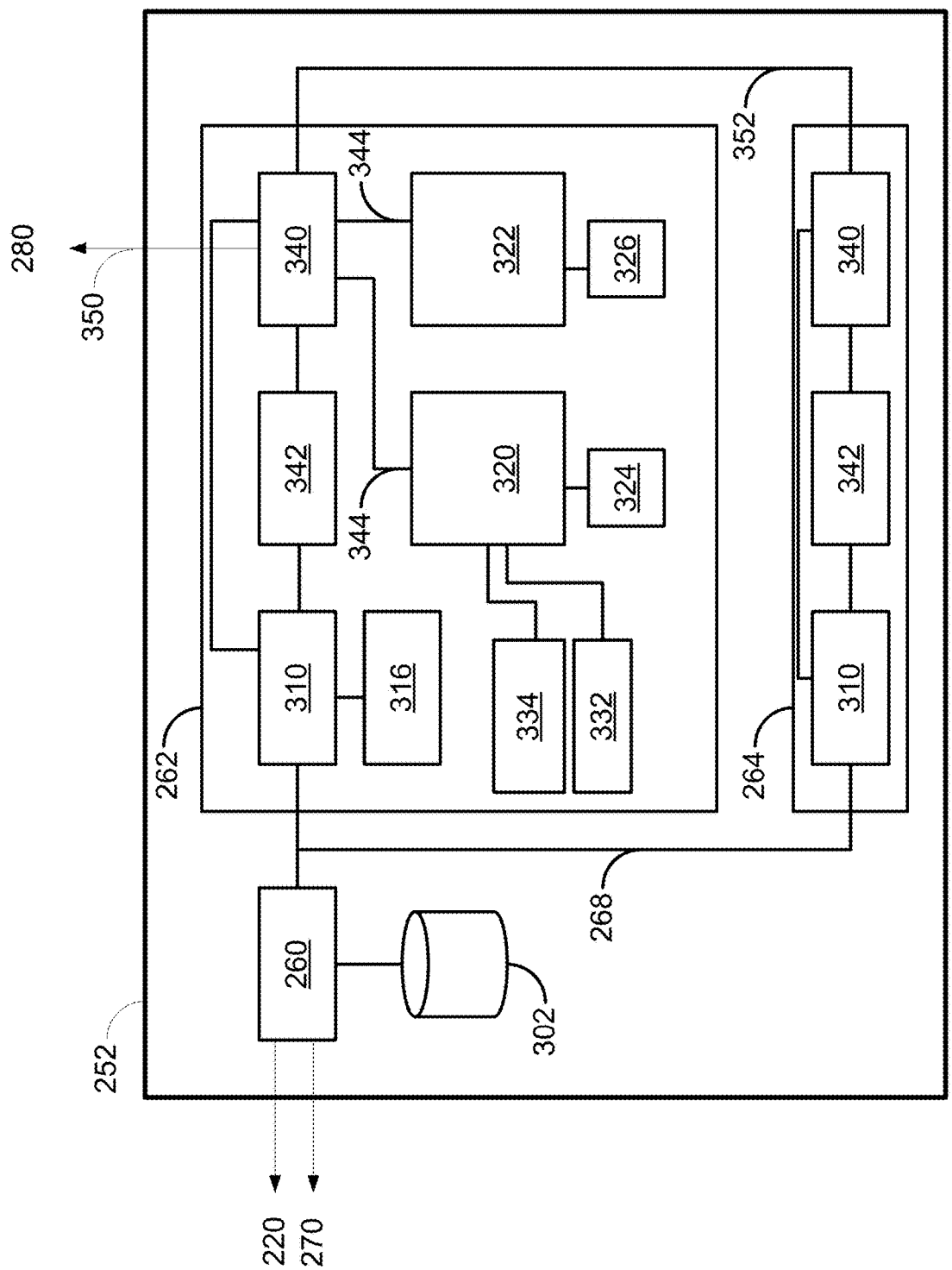
FIG. 3 schematically illustrates an embodiment of a single blade chassis.

FIG. 3 schematically shows a single blade chassis 252 in more detail. In this figure, parts not relevant to the immediate description have been omitted. The chassis controller 260 is shown with its connections to the system management node 220 and to the management connection 270. The chassis controller 260 may be provided with a chassis data store 302 for storing chassis management data. In some embodiments, the chassis data store 302 is volatile random access memory ("RAM"), in which case data in the chassis data store 302 are accessible by the SMN 220 so long as power is applied to the blade chassis 252, even if one or more of the computing partitions has failed (e.g., due to an OS crash) or a blade has malfunctioned. In other embodiments, the chassis data store 302 is non-volatile storage such as a hard disk drive ("HDD") or a solid state drive ("SSD"). In these embodiments, data in the chassis data store 302 are accessible after the HPC system has been powered down and rebooted.

FIG. 3 shows relevant portions of specific implementations of the blades 262 and 264 for discussion purposes. The blade 262 includes a blade management controller 310 (also called a "blade controller" or "BMC") that executes system management functions at a blade level, in a manner analogous to the functions performed by the chassis controller at the chassis level. For more detail on the operations of the chassis controller and blade controller, see the section entitled "HPC System Operation" below. The blade controller 310 may be implemented as custom hardware, designed by the HPC system designer to permit communication with the chassis controller 260. In addition, the blade controller 310 may have its own RAM 316 to carry out its management functions. The chassis controller 260 communicates with the blade controller of each blade using the local management bus 268, as shown in FIG. 3 and the previous figures.

The blade 262 also includes one or more microprocessors 320, 322 (alternatively referred to as "processors 320 or 322" or generically referred to as "processors 320") that are connected to RAM 324, 326. Blade 262 may be alternately configured so that multiple processors may access a common set of RAM on a single bus, as is known in the art. It should also be appreciated that processors 320, 322 may include any number of central processing units ("CPUs") or cores, as is known in the art. The processors 320, 322 in the blade 262 are connected to other items, such as a data bus that communicates with I/O devices 332, a data bus that communicates with non-volatile storage 334, and other buses commonly found in standalone computing systems. (For clarity, FIG. 3 shows only the connections from processor 320 to these other devices.) The processors 320, 322 may be, for example, Intel® Core™ processors manufactured by Intel Corporation. The I/O bus may be, for example, a PCI or PCI Express ("PCIe") bus. The storage bus may be, for example, a SATA, SCSI, or Fibre Channel bus. It will be appreciated that other bus standards, processor types, and processor manufacturers may be used in accordance with illustrative embodiments of the present invention.

Each blade (e.g., the blades 262 and 264) includes an application-specific integrated circuit 340 (also referred to as an "ASIC", "hub chip", or "hub ASIC") that controls much of its functionality. More specifically, to logically connect the processors 320, 322, RAM 324, 326, and other devices 332, 334 together to form a managed, multi-processor, (optionally) coherently-shared distributed-memory HPC system, the processors 320, 322 are electrically connected to the hub ASIC 340. The hub ASIC 340 thus provides an interface between the HPC system management functions generated by the SMN 220, chassis controller 260, and blade controller 310, and the computing resources of the blade 262.

In this connection, the hub ASIC 340 connects with the blade controller 310 either through a direct connection, or by way of a field-programmable gate array ("FPGA") 342 or similar programmable device for passing signals between integrated circuits. Those skilled in the art can select the appropriate connection between the hub ASIC 340 and the blade controller 310. Discussion of the direct connection or indirect connection should not limit various embodiments of the invention.

In particular, signals are generated on output pins of the blade controller 310, in response to commands issued by the chassis controller 260. In the indirect connection case, these signals are translated by the FPGA 342 into commands for certain input pins of the hub ASIC 340, and vice versa. For example, a "power on" signal received by the blade controller 310 from the chassis controller 260 requires, among other things, providing a "power on" voltage to a certain pin on the hub ASIC 340; the FPGA 342 facilitates this task.

The field-programmable nature of the FPGA 342 permits the interface between the blade controller 310 and ASIC 340 to be reprogrammable after manufacturing. Thus, for example, the blade controller 310 and ASIC 340 may be designed to have certain generic functions, and the FPGA 342 may be used advantageously to program the use of those functions in an application-specific way. The communications interface between the blade controller 310 and ASIC 340 also may be updated if a hardware design error is discovered in either module, permitting a quick system repair without requiring new hardware to be fabricated.

Also in connection with its role as the interface between computing resources and system management, the hub ASIC 340 is connected to the processors 320, 322 by way of a high-speed processor interconnect 344. In one embodiment, the processors 320, 322 are manufactured by Intel Corporation which provides the Intel® QuickPath Interconnect ("QPI") for this purpose, and the hub ASIC 340 includes a module for communicating with the processors 320, 322 using QPI. Other embodiments may use other processor interconnect configurations.

The hub chip 340 in each blade also provides connections to other blades for high-bandwidth, low-latency data communications. Thus, the hub chip 340 includes a link 350 to the computing connection 280 that connects different blade chassis. This link 350 may be implemented using networking cables, for example. The hub ASIC 340 also includes connections to other blades in the same blade chassis 252. The hub ASIC 340 of blade 262 connects to the hub ASIC 340 of blade 264 by way of a chassis computing connection 352. The chassis computing connection 352 may be implemented as a data bus on a backplane of the blade chassis 252 rather than using networking cables, advantageously allowing the very high speed data communication between blades that is required for high-performance computing tasks. Data communication on both the inter-chassis computing connection 280 and the intra-chassis computing connection 352 may be implemented using the NumaLink protocol or a similar protocol.

Blade Cooling

Figure 4:
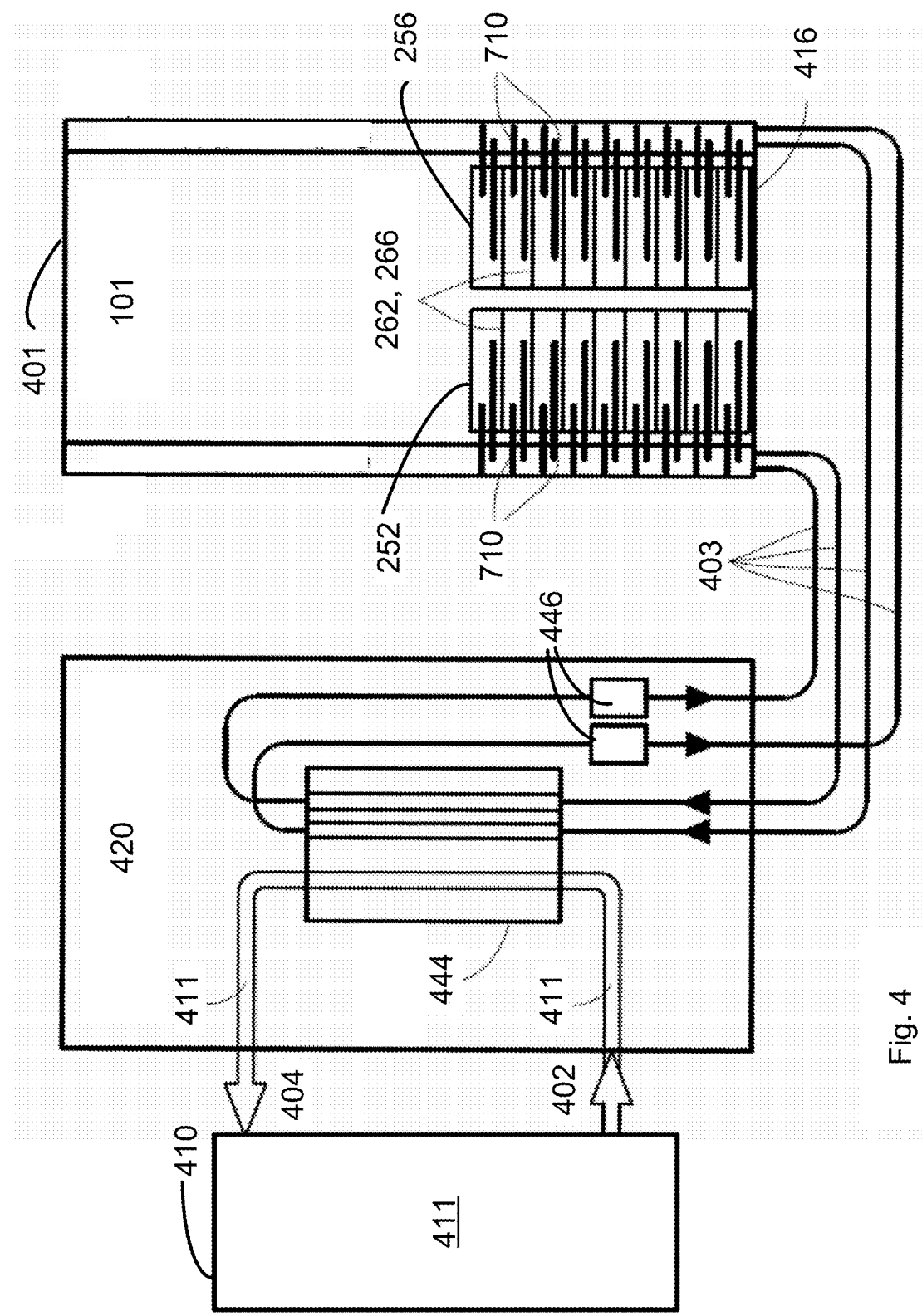
FIG. 4 schematically illustrates an embodiment of a high performance computer with a liquid cooling system.

FIG. 4 schematically illustrates a high performance computer system 100 including a housing 401 and a liquid cooling system. The cooling system receives cooling fluid 411 (e.g., water; glycol; a mixture of water and glycol, etc.) from a source 410, which may be a thermal reservoir (also referred to as a cooling reservoir) or a water supply from the facility in which the computer 100 is located. In illustrative embodiments, the cooling fluid 411 flows from its source 410 to a cooling distribution unit 420 via a first fluid pipe 402. In some embodiments, the cooling distribution unit 420 may include a heat exchanger 444 in which the cooling fluid 411 from source 410 receives heat from cooling fluid 411 that has circulated to one or more blades, such as blade 262 in blade chassis 252 and blade 266 in blade chassis 256 in blade enclosure 416 for example. In some embodiments, however, the cooling distribution unit 420 omits the heat exchanger 444 and circulates cooling fluid 411 from source 410 to cool blades 262 without passing through a heat exchanger.

The cooling fluid 411 circulates around and/or within the high performance computer 100 via one or more pumps 446. For example, in the embodiment of FIG. 4, the cooling fluid 411 circulates through a liquid cooling system 800 among several blades 262 disposed within a blade enclosure 416, within the computer housing 401. In some embodiments, the cooling fluid 411 is returned from the high performance computer 100 to the source 410 via a return pipe 404.

FIG. 5A schematically illustrates a cooling apparatus for blade electronics 502 of a blade 262 of a high performance computer 100 according to various embodiments. Illustrative embodiments describe use of the cooling apparatus with a DIMM, but the blade electronics are not limited to DIMMs, and could be another integrated circuit, for example.

A thermally conductive conduit 501 on the blade 262 extends between a heat pipe 601 (coupled to blade electronics 502) and a liquid cooling loop 810, and thereby enables transfer of thermal energy laterally across the face 512 of the blade 262, from the blade electronics 502 to a liquid cooling loop 810, even though the blade electronics 502 and liquid cooling loop 810 are not in direct physical contact with each other. Such embodiment are beneficial on a blade 262 on which it may not be possible or desirable to bring a liquid cooling loop 810 in to direct, thermally conductive contact with blade electronics 502. In preferred embodiments, the thermally conductive conduit 501 is a dry thermal communication path on the blade 262 that interfaces to a cooling loop 810 that is not on the blade 262. As used herein, two objects are in "dry thermal communication" when thermal energy can transfer from one of the objects to the other without a flow of liquid between them.

Some embodiments of the thermally conductive conduit 501 change the direction of heat flow from the heat pipe 601 to a cooling loop 810 by turning at an angle 505, as schematically illustrated in FIG. 5B for example. Such a conduit may be described as curved, or bent, and follows a circuitous path. In such embodiments, a component of a thermally conductive conduit 501, such as a transfer bar 700, may include a bend at the angle 505, or two or more components, such as two transfer bars 700, may be in thermal contact with one another and disposed at an angle 505 relative to one another. Such embodiments allow a blade designer to design a thermally conductive conduit 501 to transfer heat from a heat pipe 601 to a cooling loop 810 without limiting the path of thermally conductive conduit 501 to a straight line, and free the board designer to arrange other components on the blade 262 (e.g., processors 320) and/or the location of the cooling loop 810, as desired, because the thermally conductive conduit 501 can be configured to accommodate such arrangements and move heat around the blade 262 from its source to the cooling loop.

To these ends, in some embodiments, each of the components of the thermally conductive conduit 501 between the heat pipe 601 and the cooling loop 810 has a thermal conductivity (k) of at least 50 or W/(mK) [or $Wm^{-1}K^{-1}$] or 100 W/(mK) at room temperature, along its entire length. For example, the components may be made of one or more of aluminum, which has a thermal conductivity of approximately at least 200 W/(mK), and copper, which has a thermal conductivity (k) of approximately 300 W/(mK). In contrast, FR4 circuit board material has a thermal conductivity (k) of less than one.

Moreover, in preferred embodiments, all components of the thermally conductive conduit 501 have a thermal conductivity greater than that of the surrounding environment, and greater than that of the substrate (e.g., circuit board) 511 of the blade 262. In this way, the components of the thermally conductive conduit 501 form a path of least thermal resistance for the flow of thermal energy from the blade electronics 502 to the cooling loop 810. This desirably mitigates or prevents flow of thermal energy from the blade electronics 502 to the other components on the blade 262, and channels that flow to the reservoir 410.

Illustrative embodiments of a thermal conduit 501, described further below, include a transfer bar 700 thermally coupled between the heat pipe 601 and the cooling conduit 811. The thermally conductive conduit 501 in some embodiments also includes a transfer block 610 to physically couple the heat pipe 601 to the transfer bar 700, and/or to thermally couple the heat pipe 601 to the transfer bar 700 for example by physical touching to facilitate thermal conduction. The transfer bar 700, in some embodiments, includes an interface to a liquid cooling system 800, which is configured to receive thermal energy from the transfer bar 700 and conduct it to the thermal reservoir 410.

Figure 5C:
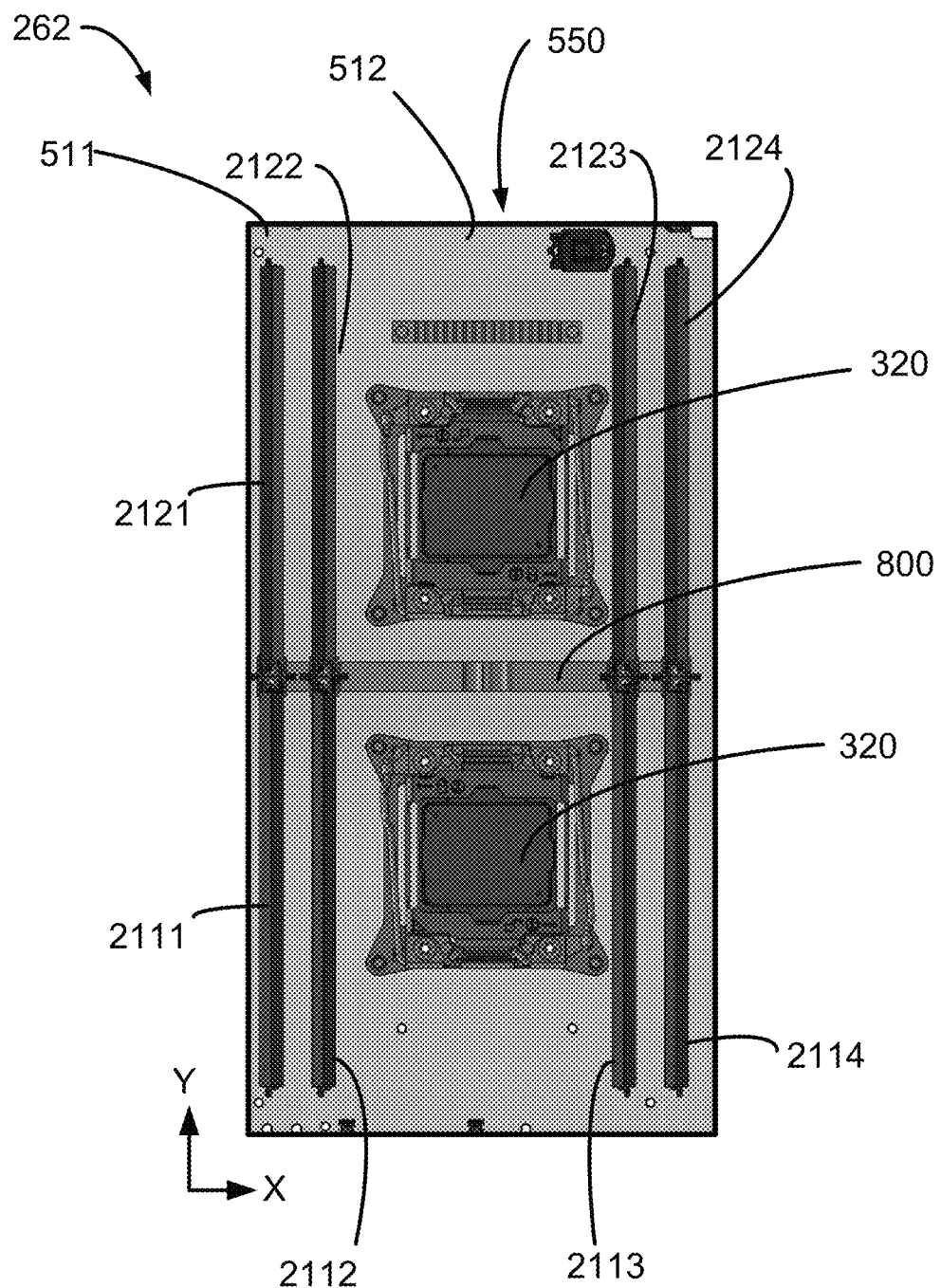
FIG. 5C and FIG. 5D schematically illustrate an embodiment of a blade of a high performance computer.
Figure 5D:
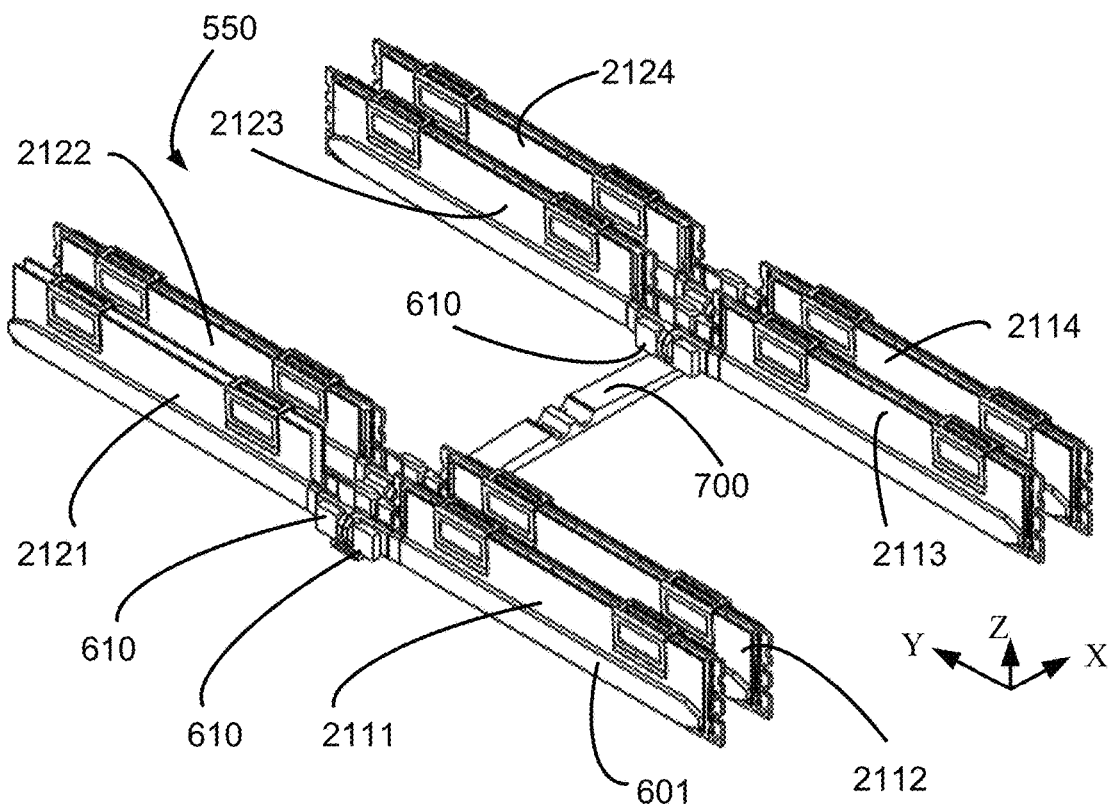

FIG. 5C and FIG. 5D schematically illustrate an embodiment of a blade 262 for a high performance computer 100, according to illustrative embodiments.

The blade 262 includes four DIMMs, 2111, 2112, 2113, and 2114 that are longitudinally abutted to another four DIMMs, 2121, 2122, 2123 and 2124, all mounted to the blade substrate 511. In this illustrative embodiment, each "DIMM" is a dual in-line memory module that includes at least one memory circuit. Embodiments of DIMMs herein may also be referred to as DIMM modules. As an example, the substrate 511 may be a printed circuit board made of FR4 material as known in the electronics industry.

In this embodiment, the DIMMS define a blade gap 550 down the center of the substrate 511, in which blade gap 550 is disposed one or more microprocessors 320 mounted on a substrate 511. The DIMMs, 2111, 2112, 2113, and 2114, and 2121, 2122, 2123 and 2124, are in digital communication with one or more of the processors 320.

The configuration of the blade 262 leaves little room for liquid conduits on the substrate 511 to couple the blade 262 to the thermal reservoir 410. Moreover, fluid coupling liquid conduits to the blade 262 would have the undesirable consequence of requiring such liquid conduit to be connected each time the blade 262 is installed in the high performance computer 100, and disconnected each time the blade 262 is removed from the high performance computer 100.

In some embodiments, two blades may be mounted face-to-face, in an arrangement which may be called "twinning," and may even be mounted so close to one another that some of their components are interdigitated. For example, in FIG. 5E, two blades, 262 and 264 are disposed adjacent to one another, and DIMMs 2111, 2112, 2113, and 2114 of blade 262 and interdigitated with the DIMMs 2211, 2212, 2213, and 2214 of blade 264, in that a line drawn parallel to the X-axis would pass through DIMM 2111, DIMM 2213, and DIMM 2112. Twinning increases the component density of the high performance computer, putting more computing power into smaller space, thereby reducing the space required for the high performance computer, and in some cases desirably shortening electrical communication paths between blades.

Figure 5E:
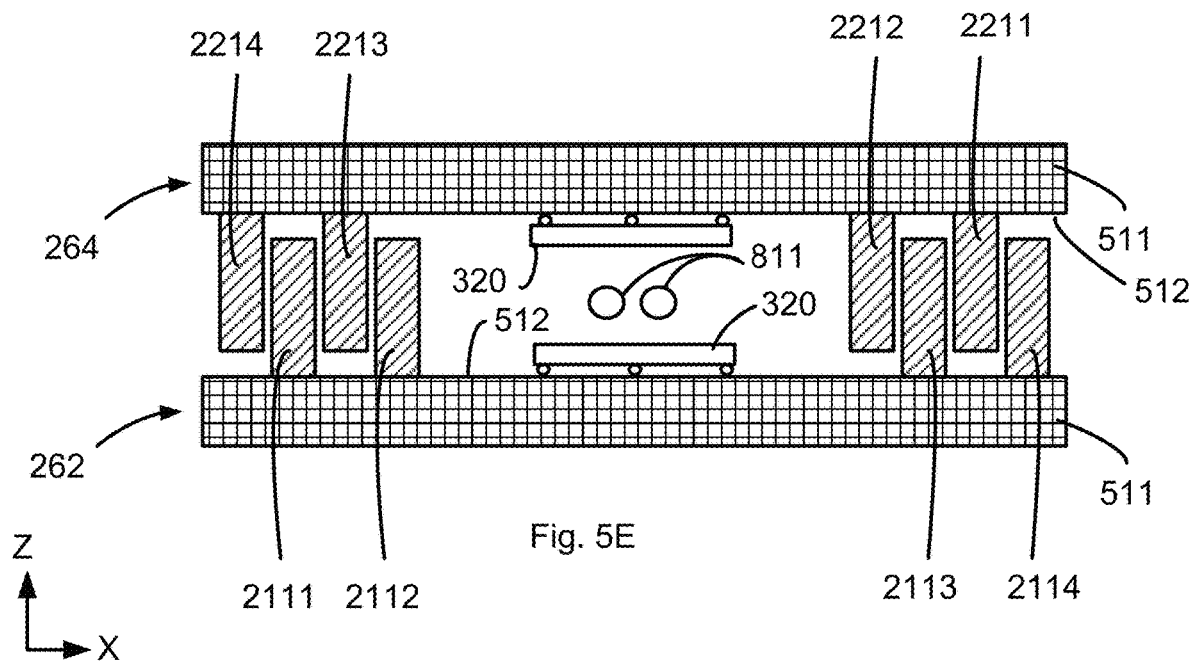
FIG. 5E schematically illustrates an embodiment of a blade of a high performance computer disposed facing another blade of the high performance computer system, with interdigitated electronic components.

FIG. 5E schematically illustrates end-views of DIMMs 2111, 2112, 2113, and 2114, and 2211, 2212, 2213, and 2214 when their respective blades 262 and 264 are in a twinned configuration. As shown in FIG. 5C-FIG. 5E, twinning leaves little room for cooling air to circulate around and between blades and DIMMS.

Consequently, some embodiments extend a cooling loop 810 across and adjacent to the face 512 of the blade 262. This configuration brings the cooling liquid 411 closer to the heat generating electronics (e.g., processor 320, DIMM 262) than systems in which the liquid is confined to the rack 101, thereby providing greater heat removal capacity.

DIMM Modules

Figures 6A, 6B:
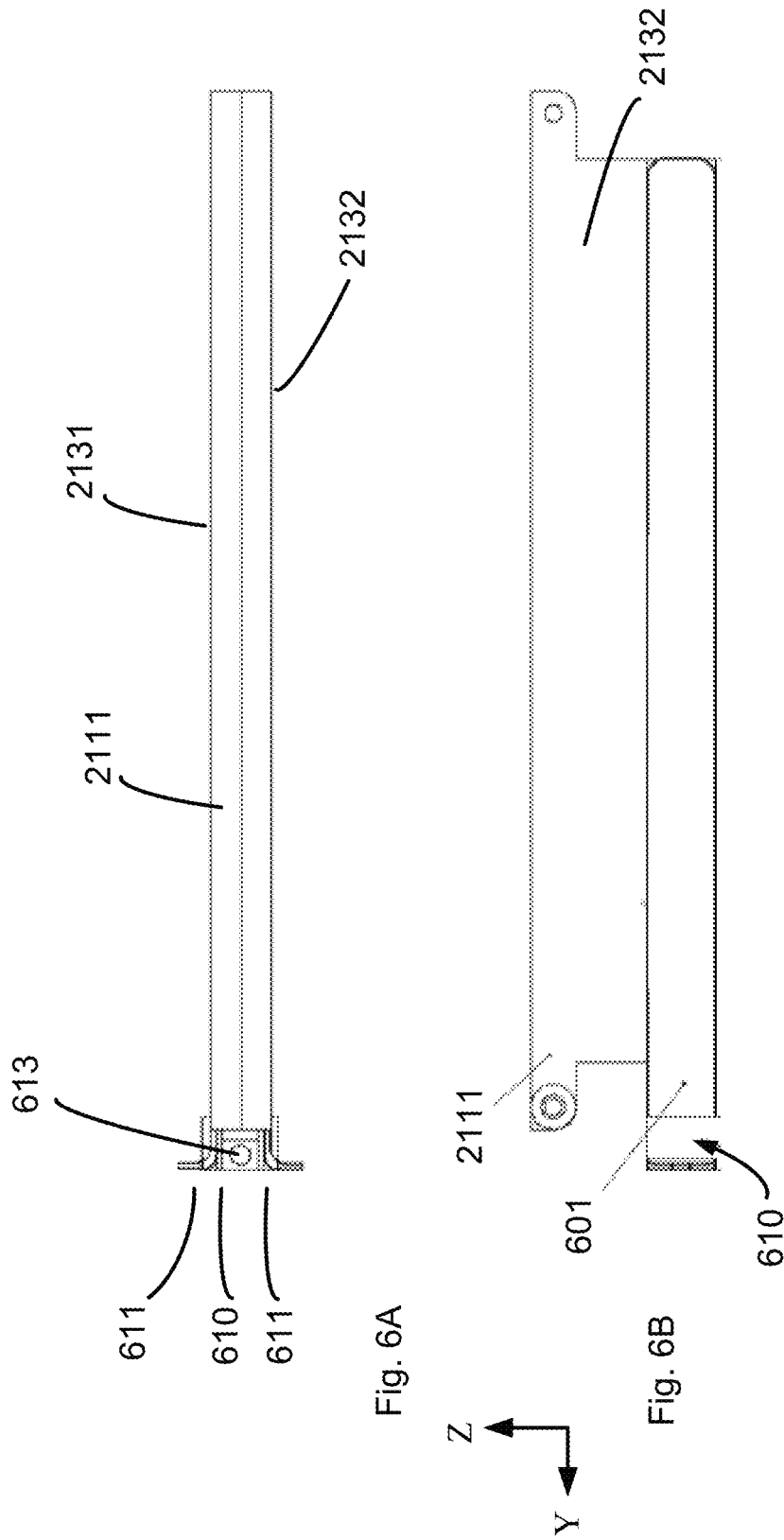

In the embodiment of FIG. 6A and FIG. 6B, a DIMM 2111 has a heat pipe 601 disposed on one side 2131, and optionally two or more heat pipes 601 disposed on the opposing sides 2131 and 2132 of the DIMM 2111. As an example, FIG. 6C schematically illustrates an end-view of a DIMM 2111, which has two heat pipes 601 (one on each side of the DIMM 2111), and FIG. 6D schematically illustrates the same DIMM 2111.

Each such heat pipe 601 is in thermal communication with the memory circuit 515 in the DIMM 2111. As known in the art, a "heat pipe" 601 is a sealed tube having two opposing ends, in which is sealed an internal wick and an evaporative fluid. Heat from a heat source (e.g., a circuit; DIMM) near a first end of the heat pipe evaporates the evaporative fluid within the heat pipe from a liquid state to a gas state. The gaseous fluid travels through the heat pipe to the second end, which is disposed near a cooling source. The gaseous fluid condenses back to a liquid state at the second end as heat from the gas transfers to the cooling source. The liquid evaporative fluid then travels back to the first end via the wick. Such a heat pipe may be described as a closed-loop system in which evaporative fluid flows, but which evaporative fluid does flow into or out of the system.

The DIMM 2111 in this embodiment has a gap pad 516 between two memory circuits 515. The gap pad 516 is preferably thermally conductive, to facilitate the transfer of heat from the memory circuits 515 to the heat pipes 601. In this embodiment, gap pad 516 is 0.5 mm thick, and has a thermal conductivity of 5.0 W/mK. As an example, in some embodiments, the gap pad 516 may be a Bergquist Gap Pad 5000S35, which is a fiberglass-reinforced filler and polymer featuring a high thermal conductivity, available from The Bergquist Company.

The DIMM 2111 of FIG. 6C also has a DIMM cover 517 enclosing the memory modules 515. The DIMM cover 517 may include two halves coupled by a fastener 614 through apertures 518. In other embodiments, the DIMM cover 517 may be secured by one or more compressive DIMM clips 519, as schematically illustrated in FIG. 6E and FIG. 6F.

In some embodiments, the heat pipe 601 is secured to the DIMM 2111 to fix the heat pipe 601 in place relative to the DIMM 2111, and to facilitate thermal conduction from the DIMM 2111 to the heat pipe 601. For example, in some embodiments, the heat pipe 601 is soldered to the DIMM 2111 and/or a transfer block 610. As shown, the longest dimension of each heat pipe 601 runs along the DIMM 2111. Consequently, when the DIMM 2111 is mounted to the a blade substrate 511, e.g., to the face 512 of the blade substrate 511, the placement and orientation of the heat pipe 601 relative to other features of the blade, or the cooling loop 810, is determined by, and matches, the placement and orientation of the DIMM.

A transfer block 610 is configured to physically and thermally interface between a heat pipe 601 and a transfer bar 700, described below with regard to FIGS. 7A-7E. In some embodiments, the transfer block 610 is configured to physically and thermally interface to multiple heat pipes, for example two heat pipes 601 on the same DIMM 2111.

In illustrative embodiments, each heat pipe 601 includes a flange 611 extending at a right angle relative to the sealed tube 602 of the heat pipe 601. The flange 611 nests with the transfer block 610, to secure the heat pipe 601 to the transfer block 610, and to conduct heat from the heat pipe 601 to the transfer block 610.

In some embodiments, the transfer block 610 is a unitary apparatus having a base portion 618 wide enough to accommodate two heat pipes 601, and two wings 619 extending upwardly from the base portion 618 to nest with flanges 611 on the heat pipes 601.

In yet other embodiments, as schematically illustrated in FIG. 6E for example, transfer block 610 has a base portion 618 configured to accommodate a single heat pipe 601, and a wing 619 extending upwardly from the base portion 618 to nest with a flanges 611 on a heat pipe 601. Some embodiments include two transfer blocks 610, in which base portions 618 of the transfer blocks 610 are configured to interlock with one another, as schematically illustrated in FIG. 6E in which the transfer block 610 on side 2131 is straight, and the base portion 618 of the transfer block 610 on side 2132 is shaped such that the two base portions 618, respectively, nest with one another. In some such embodiments, the aperture 613 of the respective base portions 618 may overlap such that a single fastener 614 may pass through both apertures 613 and secure both transfer blocks 610, and the DIMM 2111, to a transfer bar 700.

In illustrative embodiments, the heat pipe 601 is mounted between the DIMM 2111 and the blade substrate (e.g., circuit board) 511. To that end, the transfer block 610 in some embodiments includes an aperture 613 configured to allow a fastener 614 to pass through the transfer block 610 and secure to the transfer block, and therefore the rest of the DIMM 2111, to the transfer bar 700. For example, a threaded fastener 614 may mate with a threaded aperture 713 in the transfer bar 700.

Transfer Bar

An embodiment of a transfer bar 700 is schematically illustrated in FIG. 7A, FIG. 7B, FIG. 7C, FIG. 7D, and FIG. 7E. The transfer bar 700 is configured to conductively receive thermal energy from one or more heat pipes 601, for example via a transfer block 610, and conduct that thermal energy to a liquid cooling loop 810. To that end, the transfer bar 700 is made of thermally conductive material, such as copper or aluminum, to name a few examples, to facilitate transfer of heat from the DIMM 2111 to the liquid conduit 811.

FIG. 7A presents a top-view of an the transfer bar 700, FIG. 7B presents a side-view of the transfer bar 700, and FIG. 7C presents an end-view of the transfer bar 700. The transfer bar 700 has a flat bottom 701 configured to mount to the substrate 511 of the blade 262.

Figure 7D:
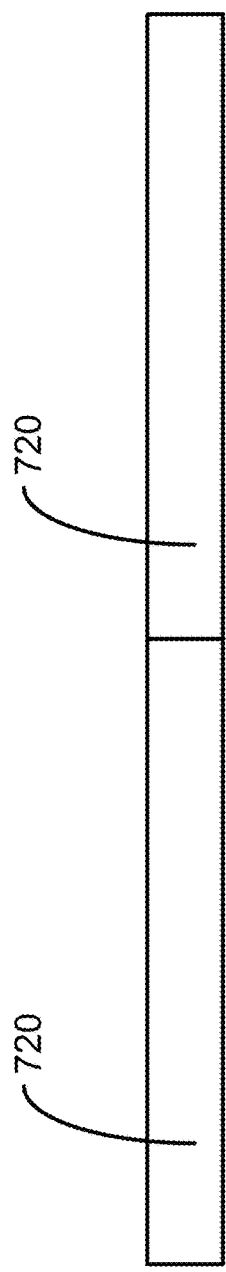
Figure 7E:
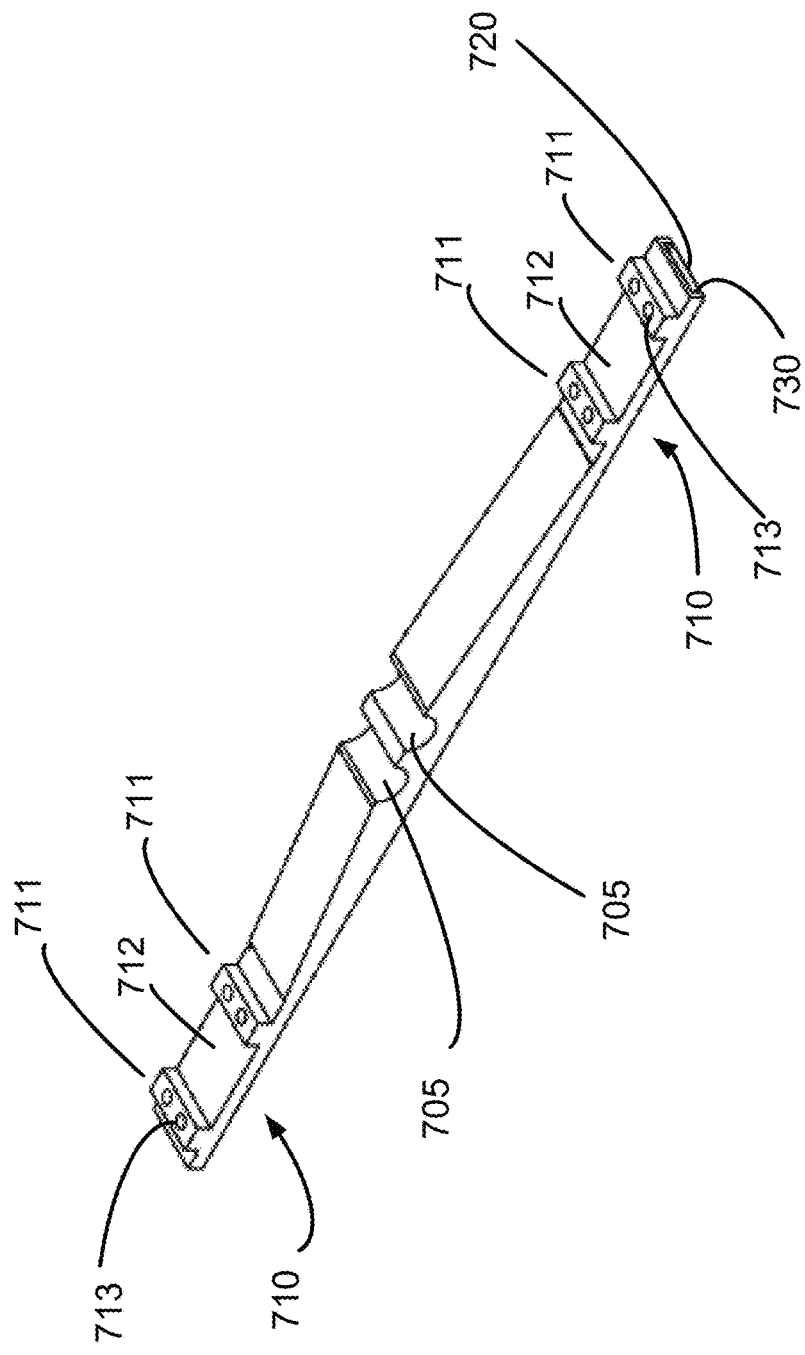

The transfer bar 700 is not a heat pipe, and in some embodiments includes only solid materials (e.g., copper; aluminum). In other embodiments, the transfer bar 700 may include, or be coupled to, one or more intermediate heat pipes 720, such as the embodiments schematically illustrated in FIG. 7D. For example, an intermediate heat pipe 720 may be disposed between the transfer bar 700 and substrate 511 of the blade 262. To that end, the intermediate heat pipe 720 may be disposed in a channel 730 in the bottom 701 of the transfer bar 700. FIG. 7E schematically illustrates a transfer bar 700 with an intermediate heat pipe 720 installed in channel 730. In any case, the intermediate heat pipe 720 may be soldered to the transfer bar 700. Such intermediate heat pipes 720 enhance the thermal conductivity of the transfer bar 700, helping to carry heat from the DIMMS to the liquid conduit 811.

The transfer bar 700 also includes one or more heat pipe interfaces 710 configured to thermally, conductively connect to one or more heat pipes 601. For example, a heat transfer block 610 of a DIMM 2111 may nest with the heat pipe interface 710. To that end, in this embodiment, each heat pipe interface 710 has a notch 712 disposed between, and defined by, two ridges 711. The notch 712 is sized and positioned to receive one or more of the heat pipes 601 and DIMM 2111. In some embodiments, two transfer blocks 610, from two longitudinally disposed DIMMS 2111, 2121, may nest in a heat pipe interface 710. Such configurations facilitate transfer of heat from a heat from a heat pipe 601 to the transfer bar 700, and may also serve to secure the heat pipe 601 relative to the transfer bar 700 and/or the blade 262. As can be understood from the foregoing description, the heat pipes 601 are in dry thermal communication with the transfer bar 700.

Some embodiments of the transfer bar 700 also have one or more conduit interfaces 705 shaped to receive a liquid conduit 811. Such an interface may be referred to as a cooling system interface. Generally, the shape of a conduit interface 705 is complementary to the shape of a liquid conduit 811, so that the liquid conduit 811 nests in the conduit interface, thereby increasing contact area between the liquid conduit 811 and the conduit interface 705, so as to promote thermal conductance. To that end, in preferred embodiments, the conduit interface 705 is contoured (not flat) and complementary to the shape of a liquid conduit 811 so that the conduit 811 fits snugly into the conduit interface 705. As an example, if the liquid conduit 811 has a convex profile (e.g., curved or circular cross-section), a conduit interface 705 has a concave profile (e.g., arc-shaped or semi-circular cross section), as schematically illustrated in FIG. 7B.

The liquid conduit 811 in some embodiments may extend parallel to the face 512 of the blade substrate 511 and simply rest in the conduit interface 705. In general, it is not necessary to bolt or otherwise secure the transfer bar 700 to the liquid conduit 811. Among other things, bolting or otherwise securing the transfer bar 700 to the liquid conduit 811 would undesirably complicate installation and removal of the blade 262.

Other embodiments may include a thermally conductive material between the liquid conduit 811 and the transfer bar 700. The conduit interfaces 705 may help secure the liquid conduit 811 in place, relative to the transfer bar 700 and/or the blade 262, and facilitate transmission of heat from the transfer bar 700 to the liquid conduit 811.

Figure 8B:
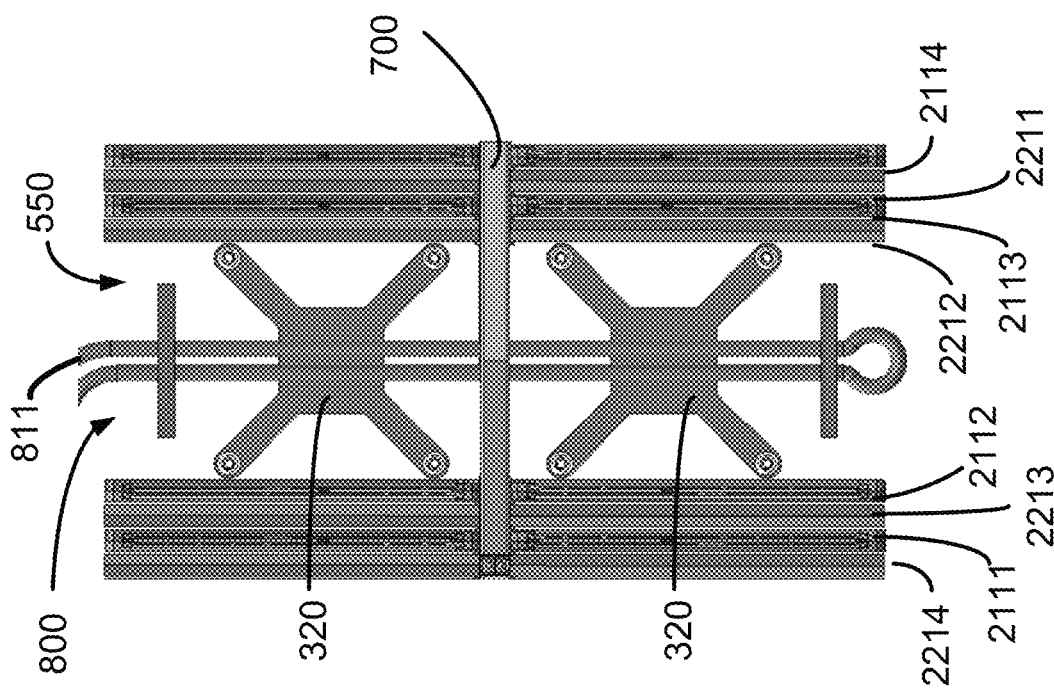
FIGS. 8A-8B schematically illustrate an embodiment of a cooling loop.
Figure 8A:
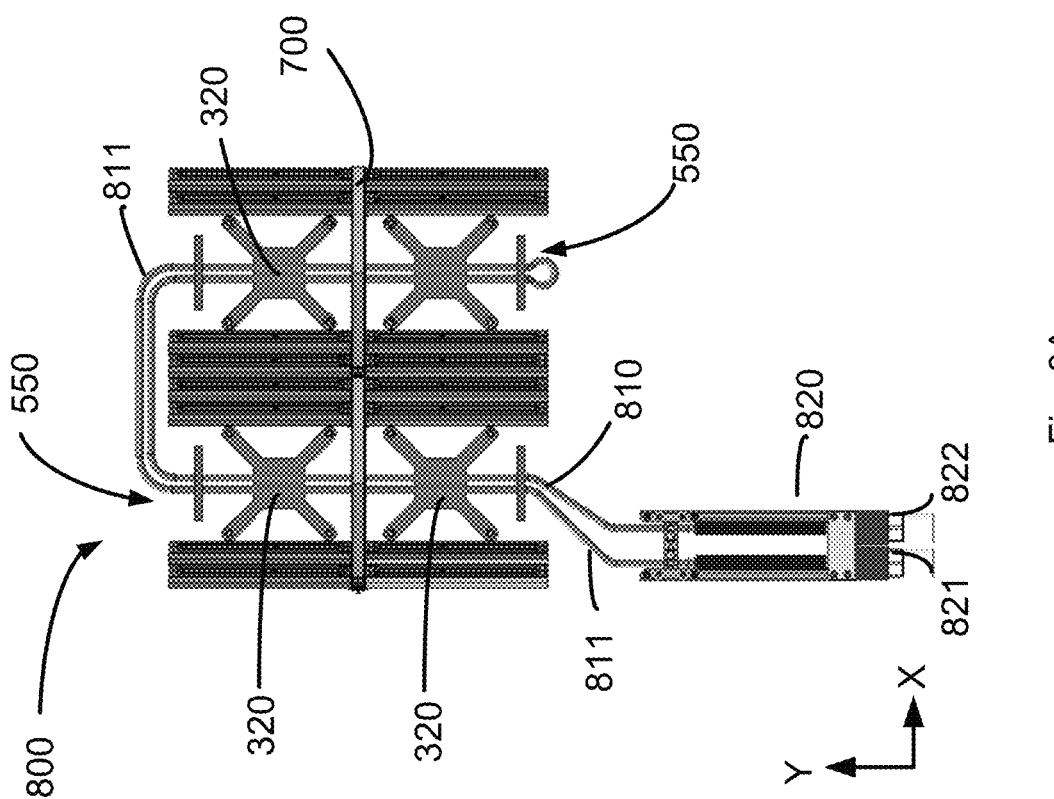

As can be understood from FIGS. 8A and 8B, the DIMMs (2111 etc.) are parallel to the liquid conduit 811 and the DIMMS, and their associated heat pipes 601, are therefore unable to couple directly to the liquid conduit 811. One benefit of the transfer bar 700, therefore, is that it can change the direction of heat flow from a heat pipe (i.e., in the Y axis in FIGS. 8A and 8B) to a direction that intersects the liquid conduit 811 (i.e., the X axis in FIGS. 8A and 8B). This presents the blade designer with greater flexibility as to the position and orientation of the DIMMs 2111 etc. relative to the liquid conduit 811.

Liquid Cooling Loop

FIGS. 8A and 8B schematically illustrate portions of an embodiment of a cooling system 800 that draws heat from the DIMMS and transports it to the thermal reservoir 410. To that end, the cooling system includes a cooling loop 810 having a liquid conduit 811 disposed adjacent to components of the blade 262, including DIMMs 2111 etc., and four processors 320.

Liquid conduit 811 is in liquid communication with the thermal reservoir 410, as described above. In operation, cooling fluid 411 from the thermal reservoir 410 enters the liquid conduit 811 via inlet coupling 821 in valve 820, circulates adjacent the blade 262 gathering heat produced by electronics (e.g., DIMMs 2111 etc.) on the blade, and exits the liquid conduit 811 via outlet coupling 822 to return to the thermal reservoir 410. As can be appreciated from FIGS. 8A and 8B, however, the liquid conduit 811 does not contact the DIMMs 2111 etc.

As described above, on the blade 262, the dry thermal conduit 501 between heat pipes 601, which are in thermal communication with the DIMMs, and the liquid conduit 811 conducts heat from the DIMM 2111 to the liquid conduit 811.

Replacing DIMM and/or Other Components

According to the foregoing embodiments, the thermally conductive dry conduit 501 may be modular in that one or more of the heat pipe 601 and transfer block 610 and/or transfer bar 700 are separable from one another. This allows a DIMM 2111 to be easily removed from the blade 262. For example, a DIMM 2111 may be removed from a blade 262 by disengaging its heat pipe 601 from its associated transfer block 610, or by disengaging the transfer block 610 from the transfer bar 700 by removing fastener 614. The DIMM 2111 may then be pulled from the blade 262. Then, the DIMM 2111 may then be replaced by a different DIMM, such as a different DIMM having a larger memory capacity or higher or lower heat generation, for example.

Similarly, the modularity allows the heat pipe 601 and/or the transfer block 610 to be removed and/or replaced, for example to replace a defective heat pipe 601 or transfer block 610, or replace the heat pipe 601 and/or the transfer block 610 with new versions having higher cooling capacity.

Dry Blade Installation and Removal

Some embodiments are configured to enable installation of a blade 262 into a high performance computer 100 without having to create a liquid connection between a liquid conduit (e.g., 811) and blade components. Similarly, in preferred embodiments, a blade 262 is configured to be removable from the high performance computer without having to break such a liquid connection because the cooling loop (e.g., liquid conduit 811) is not part of, or fixed to, the blade 262.

This is an advantage over other potential cooling concepts, which are either unable to provide the benefit of liquid cooling to electronics 502 on the blade, and/or which would require a technician to engage a liquid coupling through which cooling liquid could flow between a cooling system and some liquid conduit on the blade, and to dis-engage such a liquid coupling in order to remove the blade from the high performance computer 100. Making and/or breaking such a liquid connection increases the complexity of installing a blade into, and removing a blade from, a computer, thereby requiring a technician with appropriate training, and increasing the time required for installation and removal. Moreover, making and/or breaking such a liquid connection increases the risk of spilling liquid on the blade or other components of the computer, thereby potentially damaging the blade and/or computer, and also potentially compromising the computer's cooling system due to the loss of cooling liquid.

As an example, the conduit interfaces 705 in some embodiments are configured to enable the blade 262 to be installed in a high performance computer 100 (e.g., into a blade chassis 252) and to operably engage a cooling system 800 (e.g., liquid conduit 811) to conduct thermal energy from blade electronics 502 to the cooling system 800 without making a liquid connection, and to disengage from the cooling system 800 and be removed from the high performance computer 100 without breaking a liquid connection.

The conduit interfaces 705 in FIG. 7A are aligned along the Y-axis, and at least a portion of the liquid conduit 811 in FIG. 7A and FIG. 7B is aligned along the Y-axis. The blade chassis 252 in which the blade 262 is installed may be configured such that the blade 264 slides into and out of the blade chassis by moving along the Y-axis. In such a configuration, the conduit interfaces 705 may receive the portion of the liquid conduit 811, and may slide along the portion of the liquid conduit 811 until the blade 262 is secured in the blade chassis 252, at which position the liquid conduit 811 remains nested in the conduit interface 705 and in conductive thermal communication with the transfer bar 700. Consequently, the transfer bar 700 may be operably engaged with the liquid conduit 811; that is, the transfer bar 700 is in thermal communication (e.g., dry thermal communication) with the transfer bar 700, without having to create a liquid connection between the liquid conduit 811 and the transfer bar 700. Moreover, the transfer bar 700 may be operably engaged with the liquid conduit 811 without having to fasten the transfer bar 700 to the liquid conduit 811, for example by a bolt or intervening device.

Similarly, the blade 262 may be removed from the blade chassis 252 of the high performance computer 100 without having to break a liquid connection between the liquid conduit 811 and the transfer bar 700. In keeping with the foregoing installation example, in which the conduit interfaces 705 are aligned along the Y-axis, and at least a portion of the liquid conduit 811 is aligned along the Y-axis, the blade 262 may be removed from the blade chassis 252 by sliding the blade 262 in the opposite direction along the Y-axis. In so doing, the portion of the liquid conduit 811 disengages from the conduit interfaces 705, without disconnecting or breaking a liquid connection, and/or without removing fasteners. Note that in the foregoing illustrative examples, the cooling system 800 (e.g., the liquid conduit 811) remains in the high performance computer 100 when the blade 262 is removed, and yet when the blade 262 is installed, its transfer bar 700 (and consequently its one or more heat pipes 601 and one or more transfer blocks 610) is in dry thermal communication with the cooling system 800 (e.g., the liquid conduit 811).

Illustrative embodiments described herein enable the benefits of liquid cooling of electrical components on a blade 262 without requiring liquid flow from a liquid conduit 811 and/or thermal reservoir 410 into and/or out of the blade 262. More specifically, illustrative embodiments described herein transfer heat generated by the blade electronics into the computer's cooling loop via dry thermal communication, without liquid exchange between the cooling loop and cooling elements at the blade electronics. Although embodiments are illustrative by describing systems for cooling DIMMs, they are not limited to cooling DIMMs. For example, the blade electronics could be computer processor circuits; communications interface circuits, or power supply circuits, to name but a few examples. Consequently, As described above, a heat pipe 601 coupled to a DIMM 2111 may be in dry thermal communication with a liquid cooling loop 810 via a dry thermal conduit 501, such that heat from the DIMM 2111 transfers from the heat pipe 601 to the transfer bar 700 without flow of liquid from the heat pipe 601 to the transfer bar 700. Moreover, the transfer bar 700 may be in dry thermal communication with the liquid cooling loop 810 such that, even though cooling liquid flows in the cooling loop 810, such liquid does not flow from the transfer bar 700 to the cooling loop 810, or from the cooling loop 810 to the transfer bar 700.

The following is a list of reference numbers used herein.
- 100: High performance computer system;
- 110: System console;
- 120: Computing partition;
- 130: Computing partition;
- 140: Computing partition;
- 150: Computing partition;
- 160: Computing partition;
- 170: Computing partition;
- 180: Logical communication network;
- 191: Operating system instance;
- 192: Basic input/output system ("BIOS");
- 193: Application software;
- 194: Processor;
- 195: Volatile memory;
- 196: Non-volatile storage;
- 197: Input/output device ("I/O");
- 210: Enterprise data network;
- 220: System management node ("SMN");
- 230: Enterprise computer;
- 240: Remote computer;
- 252: Blade chassis;
- 254: Blade chassis;
- 256: Blade chassis;
- 258: Blade chassis;
- 260: Controller;
- 262: Blade;
- 264: Blade;
- 266: Blade;
- 268: Local management bus;
- 270: Management connection;
- 280: Computing connection;
- 302: Chassis data store;
- 310: Blade management controller ("blade controller" or "BMC");
- 316: Random access memory ("RAM");
- 320: Processor;
- 322: Processor;
- 324: Random access memory ("RAM");
- 326: Random access memory ("RAM");
- 332: Input/output device ("I/O");
- 334: Non-volatile storage;
- 340: Application-specific integrated circuit ("ASIC," or "hub chip," or "hub ASIC");
- 342: Programmable device (e.g., field-programmable gate array," "FPGA");
- 344: High-speed processor interconnect;
- 401: High performance computer housing;
- 402: Pipe from thermal reservoir;
- 403: Pipe from cooling distribution unit;
- 404: Return pipe;
- 410: Thermal reservoir;
- 411: Cooling fluid;
- 416: Blade enclosure;
- 420: Cooling distribution unit;
- 444: Heat Exchanger;
- 446: Pump;
- 501: High thermal-conductivity conduit;
- 502: Blade electronics;
- 505: Angle;
- 511: Blade substrate (e.g., printed circuit board);
- 512: Face of blade substrate;
- 515: Memory circuit;
- 516: Gap pad;
- 517: DIMM cover;
- 518: Aperture in DIMM cover;
- 519: DIMM cover clip;
- 550: Blade gap;
- 2111-2114: DIMM;
- 2121-2124: DIMM;
- 2211-2214 DIMM;
- 2131: First side of DIMM;
- 2132: Second side of DIMM;
- 601: Heat pipe;
- 602: Sealed tube of heat pipe;
- 610: Transfer block;
- 611: Flange;
- 613: Connector aperture;
- 614: Fastener;
- 618: Base portion of transfer block;
- 619: Wing;
- 700: Transfer bar;
- 701: Bottom of transfer bar;
- 702: Top of transfer bar;
- 705: Conduit interface;
- 710: Heat pipe interface;
- 711: Ridge;
- 712: Notch;
- 713: Threaded aperture;
- 720: Intermediate heat pipe;
- 730: Channel;
- 800: Cooling system;
- 810: Cooling loop;
- 811: Conduit;
- 820: Valve;
- 821: Inlet;
- 822: Outlet.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A cooling system comprising:
   multiple heat pipes configured to conductively receive thermal energy from multiple components of a blade, including dual in-line memory modules (DIMMs) that are on a face of the blade and processors on the face of the blade; and
   a dry thermal communication conduit comprising multiple transfer blocks and a transfer bar having a high thermal conductivity, the transfer blocks to thermally couple the heat pipes to the transfer bar, and the transfer bar to thermally communicate with a liquid conduit, wherein the transfer bar is disposed between the processors;

wherein the transfer bar is to thermally communicate conductively with the liquid conduit without a flow of liquid between the transfer bar and the liquid conduit.

2. The cooling system of claim 1, wherein the transfer blocks are secured to the transfer bar by at least one fastener.

3. The cooling system of claim 1, wherein the transfer bar comprises an intermediate heat pipe.

4. The cooling system of claim 1, wherein the transfer bar includes a cooling system interface that includes one or more grooves to receive the liquid conduit therein and to physically and thermally couple the transfer bar to the liquid conduit.

5. The cooling system of claim 1, wherein a heat pipe of the multiple heat pipes is coupled to the DIMM such that the DIMM is between a first heat pipe and a second heat pipe, and the first heat pipe and the second heat pipe are both coupled to a transfer block.

6. A blade of a high performance computer, comprising:
a substrate;
multiple processors mounted on the substrate;
multiple dual in-line memory modules (DIMMs) mounted on the substrate;
multiple heat pipes coupled to the DIMMs to conductively receive thermal energy from the DIMMs; and
a dry thermal communication conduit having a high thermal conductivity and comprising multiple transfer blocks and a transfer bar, the transfer blocks thermally coupling the heat pipes to the transfer bar, and wherein the transfer bar is disposed between the processors,
wherein the transfer bar is to contact and thermally communicate with a liquid conduit of the high performance computer when the blade is installed in the high performance computer without any liquid flowing between the transfer bar and the liquid conduit.

7. The blade of claim 6, wherein the liquid conduit is not fastened to the blade.

8. The blade of claim 6, wherein the transfer bar includes one or more grooves to receive the liquid conduit therein and to contact the liquid conduit.

9. The blade of claim 6, wherein the transfer bar includes a first end on a first side of the processors that is coupled to some of the DIMMs, a second end on a second side of the processors that is coupled to some of the DIMMs, and a liquid conduit interface between the first end and the second end that is to contact the liquid conduit.

10. The blade of claim 9, wherein the liquid conduit interface and the processors are aligned along a line.

11. The blade of claim 10, wherein the liquid conduit interface includes one or more grooves to receive the liquid conduit therein and to contact the liquid conduit.

12. The blade of claim 9, wherein the transfer bar is arranged between a first subset of the DIMMs and a second subset of the DIMMs, where the first subset of DIMMs extends away from the transfer bar along a first direction and the second subset of DIMMs extends away from the transfer bar along a second direction opposite the first direction.

13. A high performance computer, comprising:
a blade chassis;
the blade of claim 6 installed in the blade chassis;
the liquid conduit in contact with the transfer bar, the liquid conduit to communicate with a thermal reservoir, and wherein the liquid conduit is thermally coupled to both the processors and the transfer bar of the blade.

14. The high performance computer of claim 13, wherein the liquid conduit is not fastened to the blade, such that the blade can be removed from the blade chassis while the liquid conduit remains in the blade chassis.

15. The high performance computer of claim 13, wherein the liquid conduit includes a first portion that extends along a first direction and is thermally coupled to both of the processors and to the transfer bar, and a second portion that extends along a second direction opposite the first direction and is thermally coupled to both of the processors and to the transfer bar.

* * * * *